(12) United States Patent
Seo et al.

(10) Patent No.: US 11,744,104 B2
(45) Date of Patent: *Aug. 29, 2023

(54) DISPLAY PANEL AND ELECTRONIC DEVICE INCLUDING THE SAME

(71) Applicant: Samsung Display Co., Ltd., Yongin-si (KR)

(72) Inventors: Junghan Seo, Seoul (KR); Wooyong Sung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 18 days.

This patent is subject to a terminal disclaimer.

(21) Appl. No.: 17/385,791

(22) Filed: Jul. 26, 2021

(65) Prior Publication Data

US 2021/0359269 A1 Nov. 18, 2021

Related U.S. Application Data

(63) Continuation of application No. 16/592,625, filed on Oct. 3, 2019, now Pat. No. 11,075,362, which is a (Continued)

(30) Foreign Application Priority Data

Nov. 16, 2017 (KR) .................. 10-2017-0153370

(51) Int. Cl.
*H01L 51/52* (2006.01)
*H10K 50/844* (2023.01)
(Continued)

(52) U.S. Cl.
CPC ......... *H10K 50/8445* (2023.02); *H10K 50/84* (2023.02); *H10K 50/856* (2023.02);
(Continued)

(58) Field of Classification Search
CPC .................. H01L 51/5256; H01L 27/3251
See application file for complete search history.

(56) References Cited

U.S. PATENT DOCUMENTS 6,720,583 B2  4/2004  Nunoue et al.
7,671,364 B2  3/2010  Lee et al.
(Continued)

FOREIGN PATENT DOCUMENTS

JP  2010-14475 A  1/2010
JP  2014-96355 A  5/2014
(Continued)

OTHER PUBLICATIONS

Notice of Allowance dated Jul. 6, 2022, for corresponding Korean Patent Application No. 10-2017-0153370 (5 pages).
(Continued)

*Primary Examiner* — Thao P Le
(74) *Attorney, Agent, or Firm* — Lewis Roca Rothgerber Christie LLP

(57) ABSTRACT

A display panel includes a base substrate including a front surface and a rear surface and having first and second holes, and a pixel layer on the base substrate. A display area is defined in the front surface. The first hole overlaps with the display area and penetrates the front and rear surfaces. The second hole overlaps with the display area, is adjacent to the first hole, and is recessed from the front surface. The base substrate includes a first base layer including the rear surface, a first barrier layer on the first base layer and including first inorganic films having a first refractive index, and second inorganic films having a second refractive index, a second base layer on the first barrier layer, and a second barrier layer on the second base layer and including the front surface. The first and second inorganic films are alternately stacked.

18 Claims, 12 Drawing Sheets

Related U.S. Application Data continuation of application No. 16/022,420, filed on Jun. 28, 2018, now Pat. No. 10,454,067.

(51) Int. Cl.
    *H10K 50/84*         (2023.01)
    *H10K 50/856*       (2023.01)
    *H10K 59/127*       (2023.01)
    *H10K 59/12*         (2023.01)
    *H10K 77/10*         (2023.01)
    *H10K 102/00*       (2023.01)

(52) U.S. Cl.
CPC ........... *H10K 59/127* (2023.02); *H10K 59/12* (2023.02); *H10K 77/111* (2023.02); *H10K 2102/00* (2023.02); *H10K 2102/311* (2023.02); *H10K 2102/351* (2023.02)

(56) References Cited

U.S. PATENT DOCUMENTS

| | | |
|---|---|---|
| 8,766,269 B2 | 7/2014 | Yamazaki et al. |
| 9,025,108 B2 | 5/2015 | Cho et al. |
| 9,105,871 B2 | 8/2015 | Hamm |
| 9,543,364 B2 | 1/2017 | Rappoport et al. |
| 9,812,667 B2 | 11/2017 | Dighde et al. |
| 9,825,103 B2 | 11/2017 | Rappoport et al. |
| 10,454,067 B2 * | 10/2019 | Seo .................... H01L 27/3234 |
| 11,075,362 B2 * | 7/2021 | Seo .................... H01L 27/3234 |
| 11,374,199 B2 * | 6/2022 | Wang .................. H01L 27/3234 |
| 11,374,200 B2 * | 6/2022 | Seon .................. H01L 51/0096 |
| 2005/0012694 A1 | 1/2005 | Park et al. |
| 2005/0263775 A1 | 12/2005 | Ikeda et al. |
| 2006/0175965 A1 | 8/2006 | Lim |
| 2010/0096633 A1 | 4/2010 | Hatano et al. |
| 2010/0289023 A1 | 11/2010 | Choi et al. |
| 2011/0079783 A1 | 4/2011 | Choi |
| 2014/0346496 A1 | 11/2014 | Ro et al. |
| 2016/0126494 A1 | 5/2016 | Jung et al. |
| 2016/0148981 A1 | 5/2016 | Matsueda |
| 2016/0202515 A1 | 7/2016 | Watanabe et al. |
| 2017/0026553 A1 | 1/2017 | Lee et al. |
| 2017/0148856 A1 | 5/2017 | Choi et al. |
| 2018/0053918 A1 | 2/2018 | Woo et al. |
| 2018/0190940 A1 | 7/2018 | Liu et al. |
| 2019/0096919 A1 | 3/2019 | Matsukizono |
| 2022/0302220 A1 * | 9/2022 | Baek .................. H01L 51/5275 |
| 2022/0310726 A1 * | 9/2022 | Yan, Sr. .................. H01L 51/56 |

FOREIGN PATENT DOCUMENTS

| | | |
|---|---|---|
| JP | 2017-518204 A | 7/2017 |
| KR | 10-0440187 B1 | 7/2004 |
| KR | 10-2006-0090522 | 8/2006 |
| KR | 10-2007-0043488 | 4/2007 |
| KR | 10-2014-0014525 A | 2/2014 |
| KR | 10-2017-0059864 A | 5/2017 |
| KR | 1020190018120 A | 2/2019 |
| WO | WO 2015/172847 A1 | 11/2015 |

OTHER PUBLICATIONS

Extended European Search Report for corresponding European Patent Application No. 18194427.3, dated Aug. 1, 2019, 10 pages.

* cited by examiner

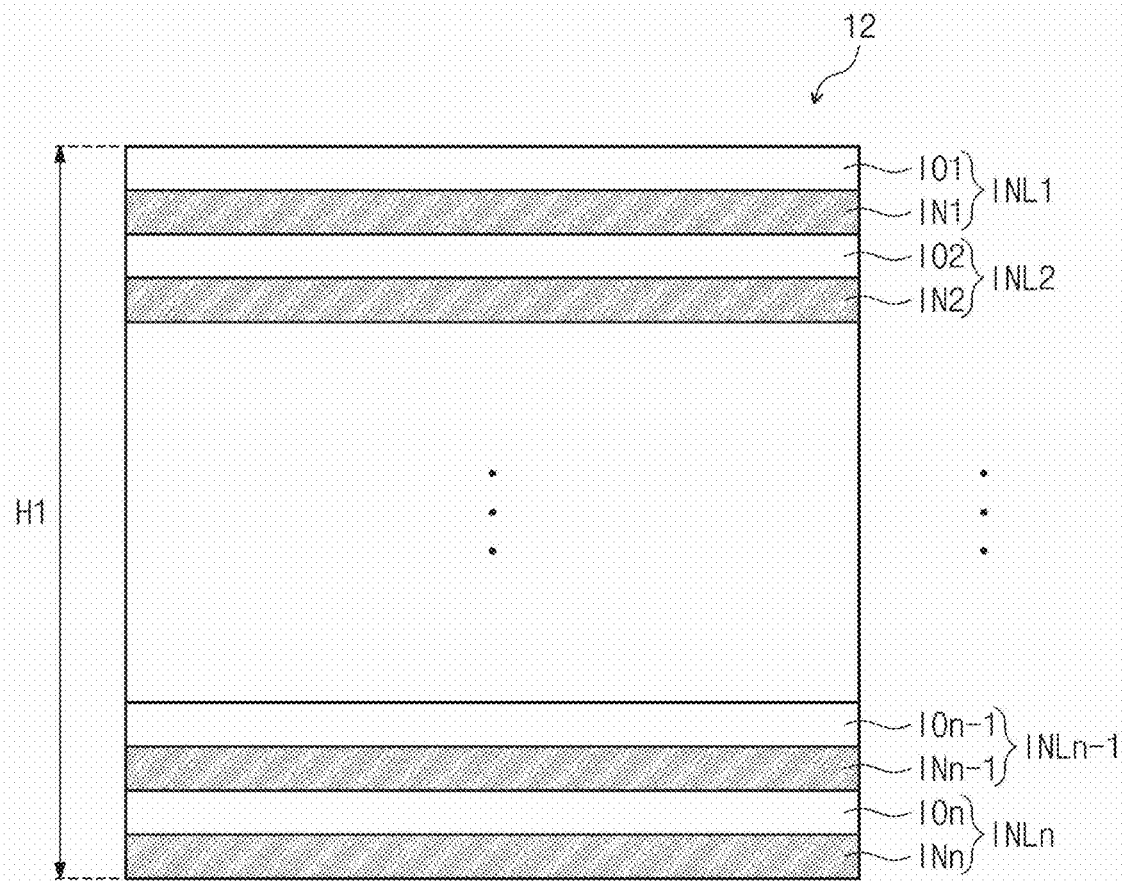

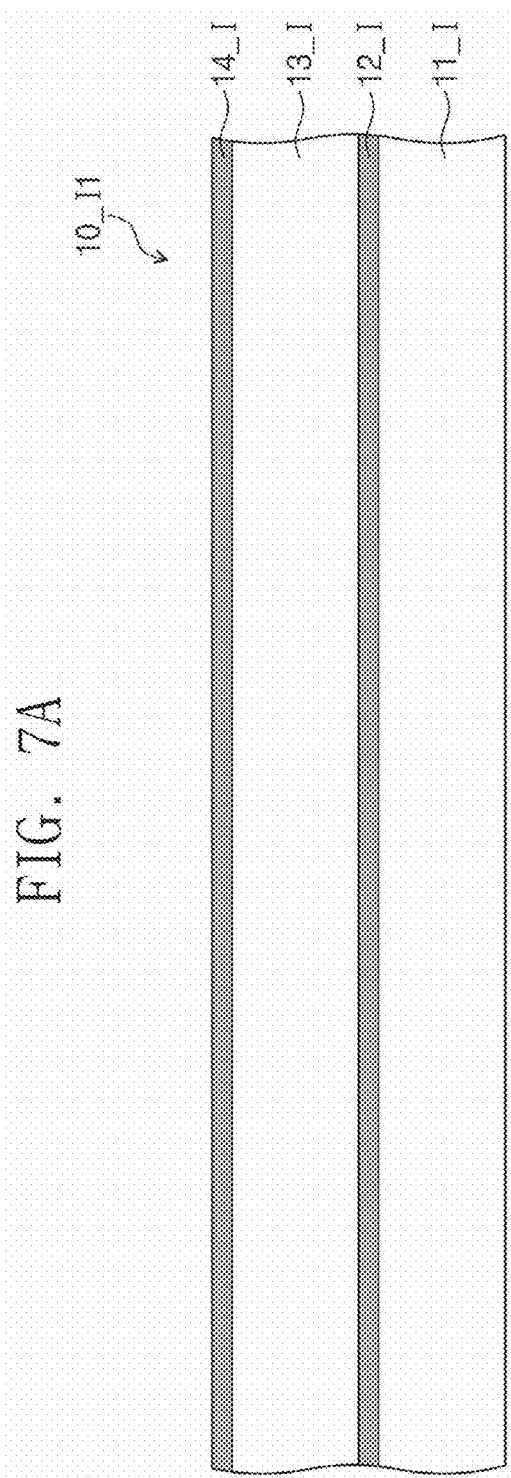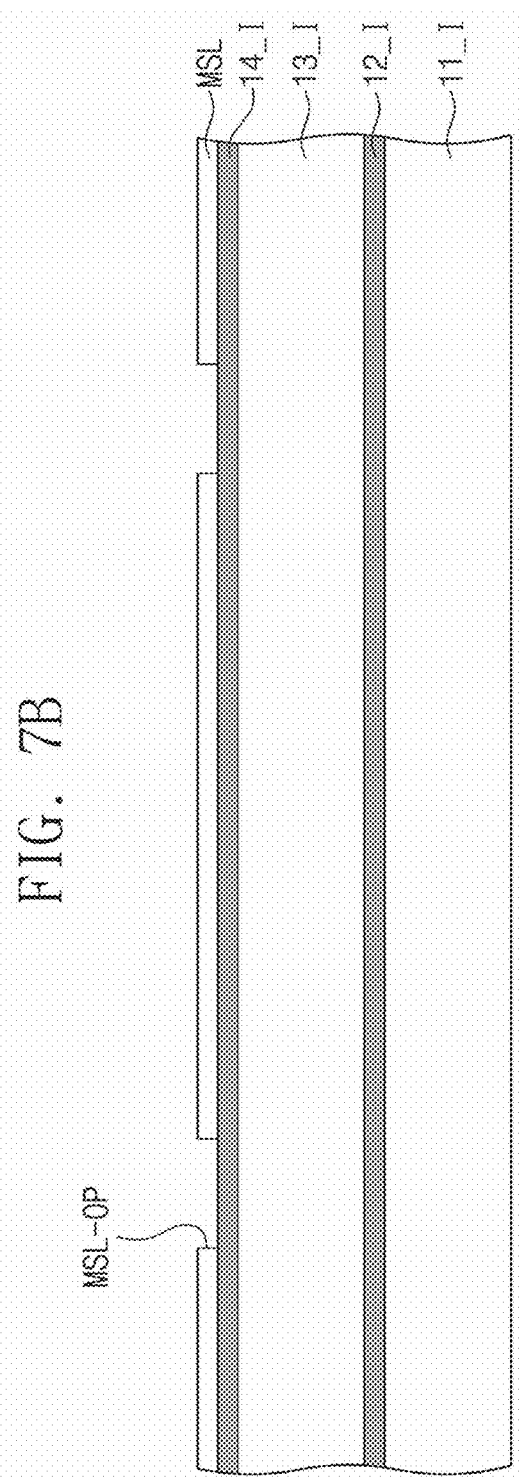

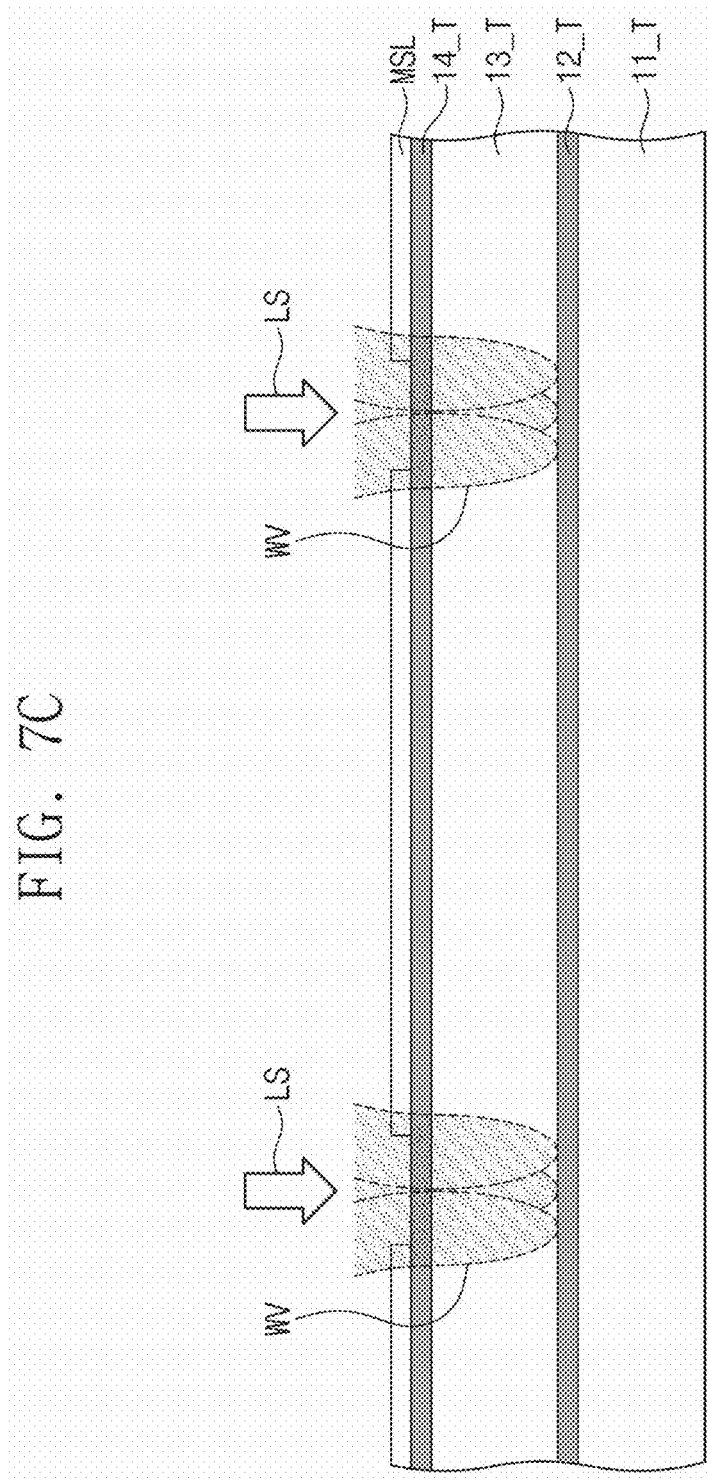

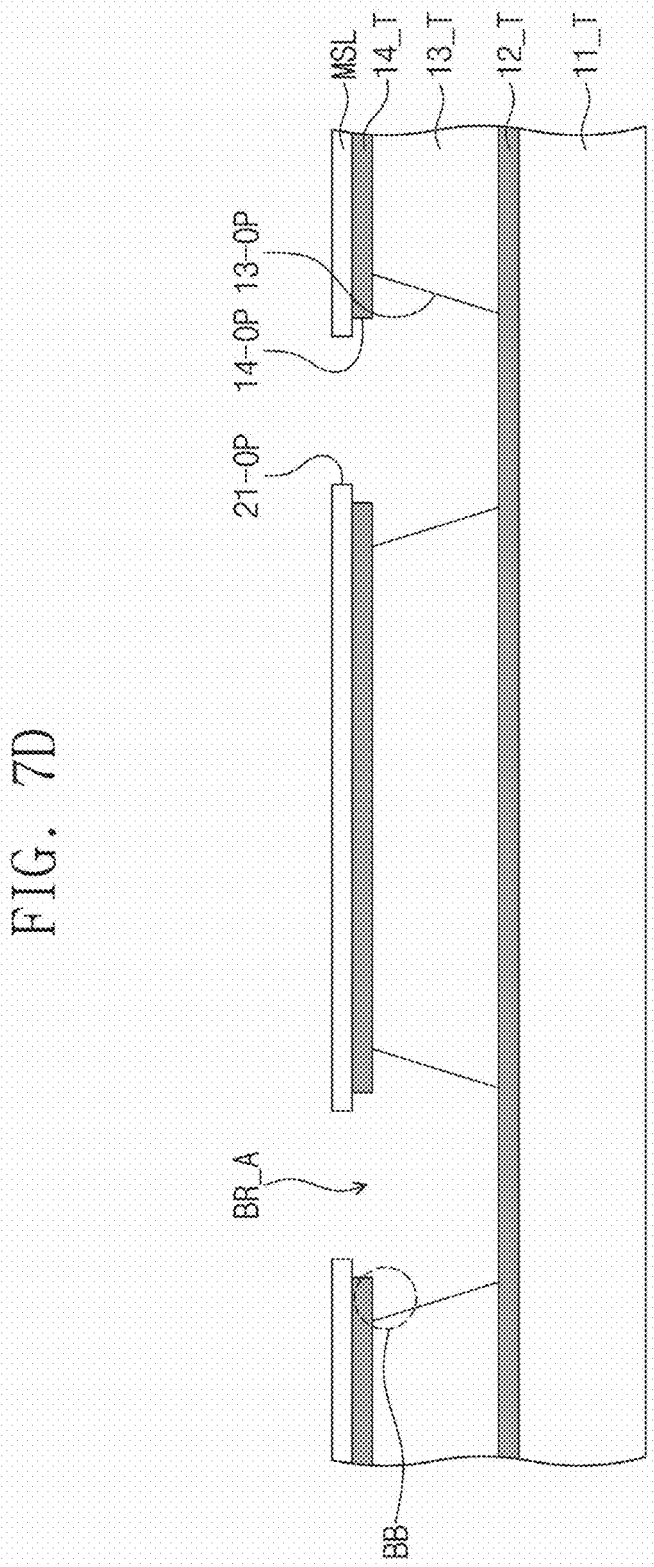

DISPLAY PANEL AND ELECTRONIC DEVICE INCLUDING THE SAME

CROSS-REFERENCE TO RELATED APPLICATIONS

This application is a continuation of U.S. patent application Ser. No. 16/592,625, filed on Oct. 3, 2019, which is a continuation of U.S. patent application Ser. No. 16/022,420, filed on Jun. 28, 2018, now U.S. Pat. No. 10,454,067, which claims priority to and the benefit of Korean Patent Application No. 10-2017-0153370, filed on Nov. 16, 2017 in the Korean Intellectual Property Office, the entire content of each of which is herein incorporated by reference.

BACKGROUND

1. Field

Aspects of embodiments of the present invention relate to a display panel and an electronic device including the same.

2. Description of the Related Art

Display devices may display images, and an organic light emitting display device is spotlighted as a next-generation display device. The organic light emitting display device has high-quality characteristics, such as low power consumption, high brightness, and a high response speed.

The organic light emitting display device may include an organic light emitting element. However, the organic light emitting element may be easily damaged by moisture or oxygen. Thus, external moisture or oxygen should be stably blocked to improve the life span and reliability of the organic light emitting display device.

SUMMARY

According to aspects of embodiments of the present invention, a display panel having improved reliability and an electronic device including the same are provided. According to further aspects of embodiments of the present invention, a display panel capable of effectively blocking an external contaminant and an electronic device including the same are provided.

According to one or more embodiments of the present invention, a display panel includes a base substrate which includes a front surface and a rear surface and in which a first hole and a second hole are defined, and a pixel layer on the base substrate. A display area may be defined in the front surface. The first hole may overlap with the display area and may penetrate the front surface and the rear surface. The second hole may overlap with the display area, may be adjacent to the first hole, and may be recessed from the front surface. The base substrate may include a first base layer including the rear surface of the base substrate, a first barrier layer on the first base layer and including a plurality of first inorganic films having a first refractive index; and a plurality of second inorganic films having a second refractive index, a second base layer on the first barrier layer, and a second barrier layer on the second base layer and including the front surface of the base substrate. The second inorganic films and the first inorganic films may be alternately stacked. The second hole may be defined in the second base layer and the second barrier layer.

In an embodiment, an uppermost film of the first barrier layer may be one of the first inorganic films, and a lowermost film of the first barrier layer may be one of the second inorganic films. The second refractive index may be higher than the first refractive index.

In an embodiment, at least two or more of the first inorganic films may have different thicknesses from each other, and at least two or more of the second inorganic films may have different thicknesses from each other.

In an embodiment, the first inorganic films and the second inorganic films may have different thicknesses from each other.

In an embodiment, a thickness of the first barrier layer may be from 550 nm to 600 nm.

In an embodiment, the first inorganic films may include silicon oxide (SiOx), and the second inorganic films may include silicon nitride (SiNx).

In an embodiment, the second hole may include a first sub-hole penetrating the second barrier layer, and a second sub-hole overlapping with the first sub-hole and defined in the second base layer.

In an embodiment, a width of the second sub-hole defined in the second base layer may be greater than a width of the first sub-hole penetrating the second barrier layer.

In an embodiment, the pixel layer may include a cover layer which is disposed on the second barrier layer and in which a third sub-hole overlapping with the second hole is defined.

In an embodiment, a width of the third sub-hole of the cover layer may be equal to or less than a width of the first sub-hole of the second barrier layer.

In an embodiment, the pixel layer may include a thin film element layer on the base substrate and including a thin film transistor, and a display element layer on the base substrate and including an organic light emitting element connected to the thin film transistor.

In an embodiment, the display area may include a hole area overlapping with the first hole, a peripheral area surrounding the hole area and overlapping with the second hole, and a pixel area surrounding the peripheral area and overlapping with the organic light emitting element. The organic light emitting element may not overlap with the peripheral area.

In an embodiment, the pixel layer may not overlap with the hole area.

In an embodiment, a third hole may further be defined in the base substrate. The third hole may overlap with the display area and may be closer to the second hole than to the first hole, when viewed in a plan view. The third hole may be recessed from the front surface of the base substrate.

In an embodiment, the third hole may include a third sub-hole penetrating the second barrier layer, and a fourth sub-hole overlapping with the third sub-hole and defined in the second base layer.

In an embodiment, a width of the fourth sub-hole defined in the second base layer may be greater than a width of the third sub-hole penetrating the second barrier layer.

In an embodiment, the first base layer and the second base layer may include an organic material.

According to one or more embodiments of the present invention, an electronic device may include: a display panel including a base substrate which includes a front surface and a rear surface and in which a first hole and a second hole are defined, and an electronic module received in the first hole and electrically connected to the display panel. A display area and a non-display area adjacent to the display area may be defined in the front surface in a plan view. The first hole may overlap with the display area and may penetrate the front surface and the rear surface. The second hole may overlap with the display area, may be adjacent to the first hole, and may be recessed from the front surface. The base substrate may include a first base layer including the rear surface of the base substrate, a first barrier layer on the first base layer and including a plurality of first inorganic films having a first refractive index, and a plurality of second inorganic films having a second refractive index, a second base layer on the first barrier layer, and a second barrier layer on the second base layer and including the front surface of the base substrate. The second inorganic films and the first inorganic films may be alternately stacked. The second hole may be defined in the second base layer and the second barrier layer.

In an embodiment, the electronic module may include at least one of a sound output module, a camera module, or a light receiving module.

In an embodiment, the second hole may have a closed loop shape surrounding the first hole, when viewed in a plan view.

BRIEF DESCRIPTION OF THE DRAWINGS

The above and other aspects and features of the present invention will become more apparent by describing in further detail some exemplary embodiments thereof with reference to the accompanying drawings, in which:

FIG. 4 is a cross-sectional view illustrating a first barrier layer of FIG. 2, according to an embodiment of the invention;

FIGS. 7A to 7D are cross-sectional views illustrating a method of manufacturing a display panel, according to an embodiment of the invention;

DETAILED DESCRIPTION

Figure 1A:
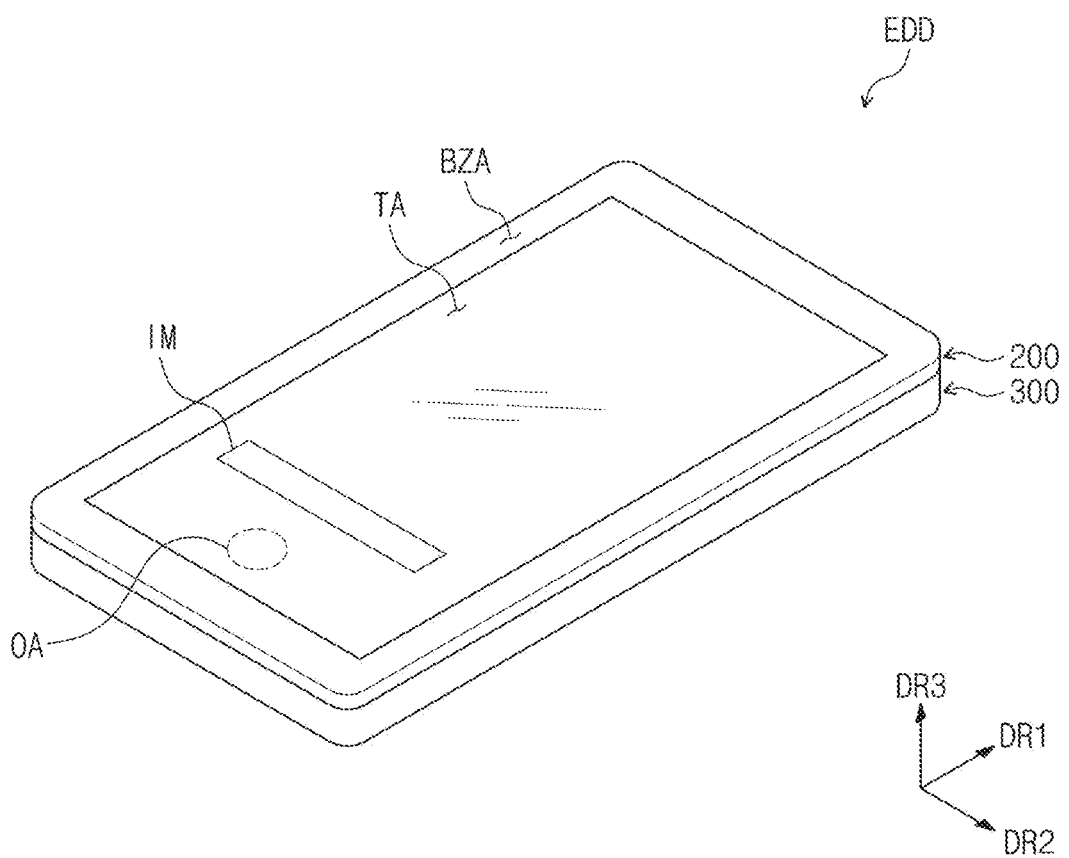
FIG. 1A is a perspective view illustrating an electronic device, according to an embodiment of the invention.

The invention now will be described more fully herein with reference to the accompanying drawings, in which various embodiments are shown. This invention may, however, be embodied in many different forms, and should not be construed as limited to the embodiments set forth herein. Rather, these embodiments are provided so that this disclosure will be thorough and complete and will convey the scope of the invention to those skilled in the art. Like reference numerals refer to like elements throughout.

It is to be understood that when an element, such as a layer, region, or substrate is referred to as being "on" another element, it may be directly on the other element or one or more intervening elements may be present. In contrast, the term "directly" means that there are no intervening elements. As used herein, the term "and/or" includes any and all combinations of one or more of the associated listed items. The terminology used herein is for the purpose of describing particular embodiments and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It is to be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a "first" element, component, region, layer, or section discussed below could be termed a "second" element, component, region, layer, or section without departing from the teachings herein. Some exemplary embodiments are described herein with reference to cross-sectional illustrations and/or plane illustrations that are idealized exemplary illustrations. In the drawings, the thicknesses of layers and regions may be exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to necessarily illustrate the actual shape of a region of a device and are not intended to limit the scope of exemplary embodiments.

Figure 1B:
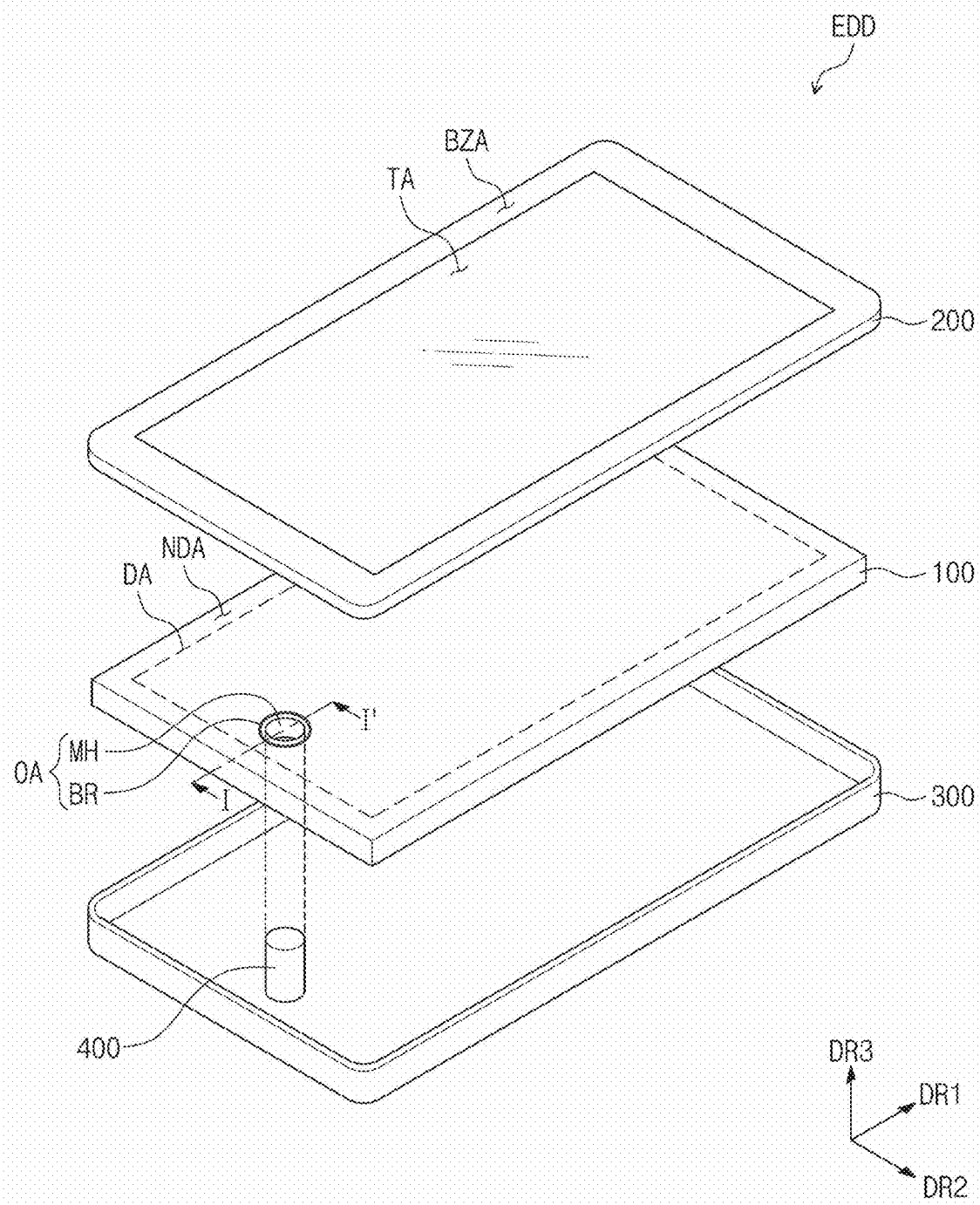
FIG. 1B is an exploded perspective view illustrating an electronic device, according to an embodiment of the invention.

FIG. 1A is a perspective view illustrating an electronic device, according to an embodiment of the invention; FIG. 1B is an exploded perspective view illustrating an electronic device, according to an embodiment of the invention; and FIG. 1C is a block diagram illustrating an electronic device, according to an embodiment of the invention.

According to an embodiment of the invention, an electronic device EDD may be activated by an electrical signal. The electronic device EDD may be realized as any of various embodiments. For example, the electronic device EDD may be realized as a tablet, a notebook computer, a personal computer, a smart television, or a smartphone. In the present embodiment, a smartphone is illustrated as an example of the electronic device EDD.

Figure 1C:
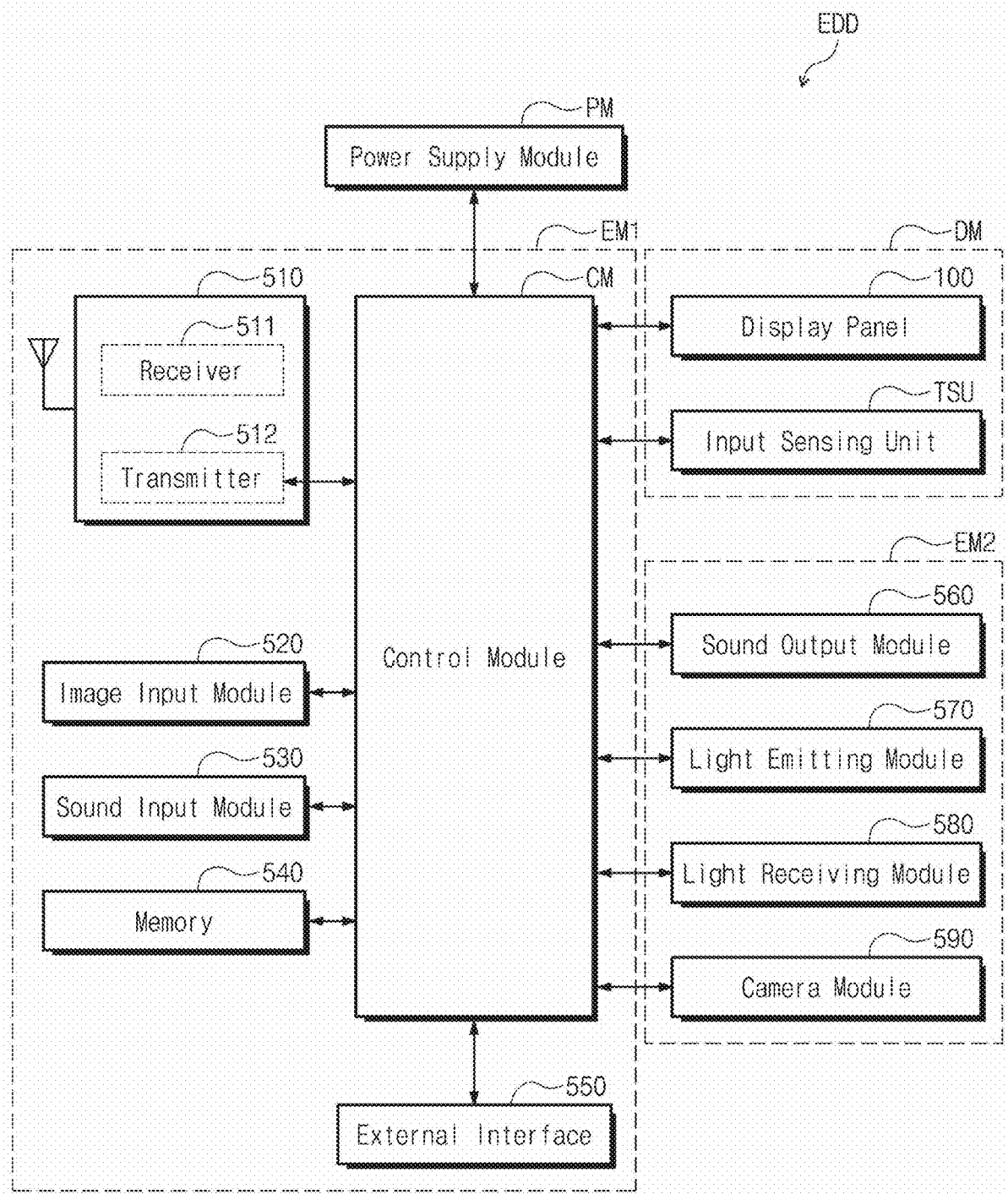
FIG. 1C is a block diagram illustrating an electronic device, according to an embodiment of the invention.

Referring to FIGS. 1A, 1B, and 1C, the electronic device EDD may provide a display surface displaying an image IM at a front surface thereof. The display surface may be parallel to a plane defined by a first direction DR1 and a second direction DR2.

A normal direction of the display surface may be indicated by a third direction DR3. The third direction DR3 may also indicate a thickness direction of the electronic device EDD. A front surface and a rear surface of each of members may be distinguished by the third direction DR3. However, the first to third directions DR1, DR2, and DR3 may be relative concepts and may be varied to be other directions.

According to FIG. 1A, the electronic device EDD may display the image IM through a transmission area TA. In FIG. 1A, an internet search box is illustrated as an example of the image IM. In an embodiment, the transmission area TA may have a quadrilateral shape parallel to the first and second directions DR1 and DR2. However, embodiments of the invention are not limited thereto, and the shape of the transmission area TA may be variously modified.

A bezel area BZA may be adjacent to the transmission area TA. In an embodiment, the bezel area BZA may surround the transmission area TA. However, embodiments of the invention are not limited thereto. In other embodiments, the bezel area BZA may be adjacent to one or more sides of the transmission area TA or may be omitted. The electronic device EDD may include any of various embodiments but may not be limited to a specific embodiment.

According to FIG. 1B, in an embodiment, the electronic device EDD may include a display panel 100, a window member 200, a housing member 300, and an electronic module 400.

As illustrated in FIG. 1C, in an embodiment, the electronic device EDD may further include a display module DM, a first electronic module EM1, a second electronic module EM2, and a power supply module PM. Some of components illustrated in FIG. 1C are not shown in the electronic device EDD illustrated in FIG. 1B for the purpose of ease and convenience in description and illustration.

In an embodiment, the display module DM may include the display panel 100 and an input sensing unit TSU. The display panel 100 may generate the image IM. The input sensing unit TSU may sense an input of a user supplied from the outside. The input of a user may include at least one of various external inputs, such as any of a part (e.g., a finger) of a body of a user, light, heat, and pressure. In an embodiment, the input sensing unit TSU may further include a touch sensor.

Referring again to FIG. 1B, a display area DA and a non-display area NDA may be defined in the display panel 100. The image IM may be generated through the display area DA. A plurality of pixels for generating the image IM may be disposed in the display area DA. This will be described later in further detail.

The non-display area NDA may be adjacent to the display area DA. In an embodiment, the non-display area NDA may surround the display area DA. A driving circuit and/or driving lines for driving the display area DA may be disposed in the non-display area NDA.

In an embodiment, although not shown in the drawings, the non-display area NDA of the display panel 100 may be partially curved. Thus, a portion of the non-display area NDA may face a front surface of the electronic device EDD, and another portion of the non-display area NDA may face a rear surface of the electronic device EDD. Alternatively, the non-display area NDA may be omitted in the display panel 100 according to another embodiment of the invention.

According to an embodiment of the invention, the display panel 100 may include a receiving portion OA overlapping with the display area DA. The receiving portion OA may include a space in which the electronic module 400 is disposed. The receiving portion OA may include a first hole MH and a second hole BR.

The first hole MH may penetrate the display panel 100. In an embodiment, the first hole MH may have a cylindrical shape having a height in the third direction DR3. The first hole MH may receive the electronic module 400. According to an embodiment, the display panel 100 includes the first hole MH, and a thin display device or electronic device may be realized.

The second hole BR may be disposed adjacent to the first hole MH. The second hole BR may be formed to be recessed from a front surface of the display panel 100. The second hole BR may have a closed loop shape surrounding the first hole MH in a portion of the display panel 100 when viewed in a plan view. In the present embodiment, the second hole BR may have a ring shape surrounding the first hole MH in a plan view.

According to an embodiment of the invention, the first hole MH may be a through-hole which penetrates the front surface and a rear surface of the display panel 100. Unlike the first hole MH, the second hole BR may not completely penetrate the display panel 100 but may penetrate only a portion of the display panel 100 in the third direction DR3. As a result, the second hole BR may not be a through-hole but may have a concave or recessed shape. The first hole MH and the second hole BR will be described later in more detail.

The window member 200 may provide the front surface of the electronic device EDD. The window member 200 may be disposed on the front surface of the display panel 100 to protect the display panel 100. In an embodiment, the window member 200 may include a glass substrate, a sapphire substrate, or a plastic film, for example. The window member 200 may have a single-layered or multi-layered structure. For example, the window member 200 may have a stack structure including a plurality of plastic films coupled to each other by an adhesive or may have a stack structure which includes a glass substrate and a plastic film coupled to each other by an adhesive.

The window member 200 may be divided into the transmission area TA and the bezel area BZA. The transmission area TA may correspond to the display area DA. For example, the transmission area TA may overlap with a whole or at least a portion of the display area DA. The image IM displayed on the display area DA of the display panel 100 may be visible to the outside through the transmission area TA.

The bezel area BZA may define the shape of the transmission area TA. In an embodiment, the bezel area BZA may be adjacent to the transmission area TA and may surround the transmission area TA in a plan view. The bezel area BZA may have a color (e.g., a predetermined color). The bezel area BZA may cover the non-display area NDA of the display panel 100 to prevent or substantially prevent the non-display area NDA from being visible to the outside. However, embodiments of the invention are not limited thereto. In another embodiment of the invention, the bezel area BZA may be omitted in the window member 200.

The housing member 300 may be coupled to the window member 200. The housing member 300 may provide the rear surface of the electronic device EDD. The housing member 300 may be coupled to the window member 200 to define an inner space, and the display panel 100, the electronic module 400 and various components may be received in the inner space. The housing member 300 may be formed of a material having relatively high rigidity. For example, the housing member 300 may include a plurality of frames and/or plates, which may be formed of glass, plastic, and/or a metal. The housing member 300 may stably protect the components of the electronic device EDD received in the inner space from an external impact.

The electronic module 400 may include at least one of various functional modules for operating the electronic device EDD.

Referring to FIG. 1C, the electronic module 400 may include at least one of components of the first and second electronic modules EM1 and EM2.

In an embodiment, the first electronic module EM1 may be mounted directly on a motherboard electrically connected to the display module DM. In another embodiment, the first electronic module EM1 may be mounted on an additional board so as to be electrically connected to the motherboard through a connector (not shown).

In an embodiment, the first electronic module EM1 may include a control module CM, a wireless communication module 510, an image input module 520, a sound input module 530, a memory 540, and an external interface 550. In an embodiment, one or more of the components (e.g., the modules) may not be mounted on the motherboard but may be electrically connected to the motherboard through a flexible circuit board.

The control module CM may control overall operations of the electronic device EDD. The control module CM may include a microprocessor. For example, the control module CM may activate or deactivate the display module DM. In an embodiment, the control module CM may control one or more other modules (e.g., the image input module 520, the sound input module 530, etc.) on the basis of a touch signal received from the display module DM.

The wireless communication module 510 may transmit/receive a wireless signal to/from one or more other terminals by using Bluetooth or Wi-Fi, for example. The wireless communication module 510 may transmit/receive a voice signal by using a general communication line. The wireless communication module 510 may include a transmitter 512 which modulates a signal to be transmitted and transmits the modulated signal, and a receiver 511 which demodulates a received signal.

The image input module 520 may process an image signal to convert the image signal into image data for displaying an image in the display module DM. The sound input module 530 may receive an external sound signal through a microphone in a recording mode or a voice recognition mode and may convert the received sound signal into electrical sound data.

In an embodiment, the external interface 550 may be connected to and interface with an external charger, a cable/wireless data port, or a card socket (e.g., a memory card or a SIM/UIM card).

In an embodiment, the second electronic module EM2 may include a sound output module 560, a light emitting module 570, a light receiving module 580, and a camera module 590. The components of the second electronic module EM2 may be mounted directly on the motherboard or may be mounted on an additional board so as to be electrically connected to the display module DM and/or the first electronic module EM1 through a connector (not shown).

The sound output module 560 may convert sound data received from the wireless communication module 510 or sound data stored in the memory 540 and may output the converted sound data to the outside.

The light emitting module 570 may generate light and may output the generated light. The light emitting module 570 may output infrared light. In an embodiment, the light emitting module 570 may include a light emitting diode (LED) element. The light receiving module 580 may sense infrared light. The light receiving module 580 may be activated when sensing the infrared light of a level (e.g. a predetermined level) or more. In an embodiment, the light receiving module 580 may include a CMOS image sensor. After the infrared light generated in the light emitting module 570 is outputted, the infrared light may be reflected by an external object (e.g., a finger or a face of a user) and the reflected infrared light may be incident to the light receiving module 580. The camera module 590 may acquire an external image.

The electronic module 400 illustrated in FIG. 1B may be one of the components of the second electronic module EM2. In this case, the other components of the first and second electronic modules EM1 and EM2 may be disposed at other positions. However, embodiments of the invention are not limited thereto. In other embodiments, the electronic module 400 may include one or more of the modules of the first and second electronic modules EM1 and EM2.

The power supply module PM may supply power for overall operations of the electronic device EDD. The power supply module PM may include a battery module.

Figure 2:
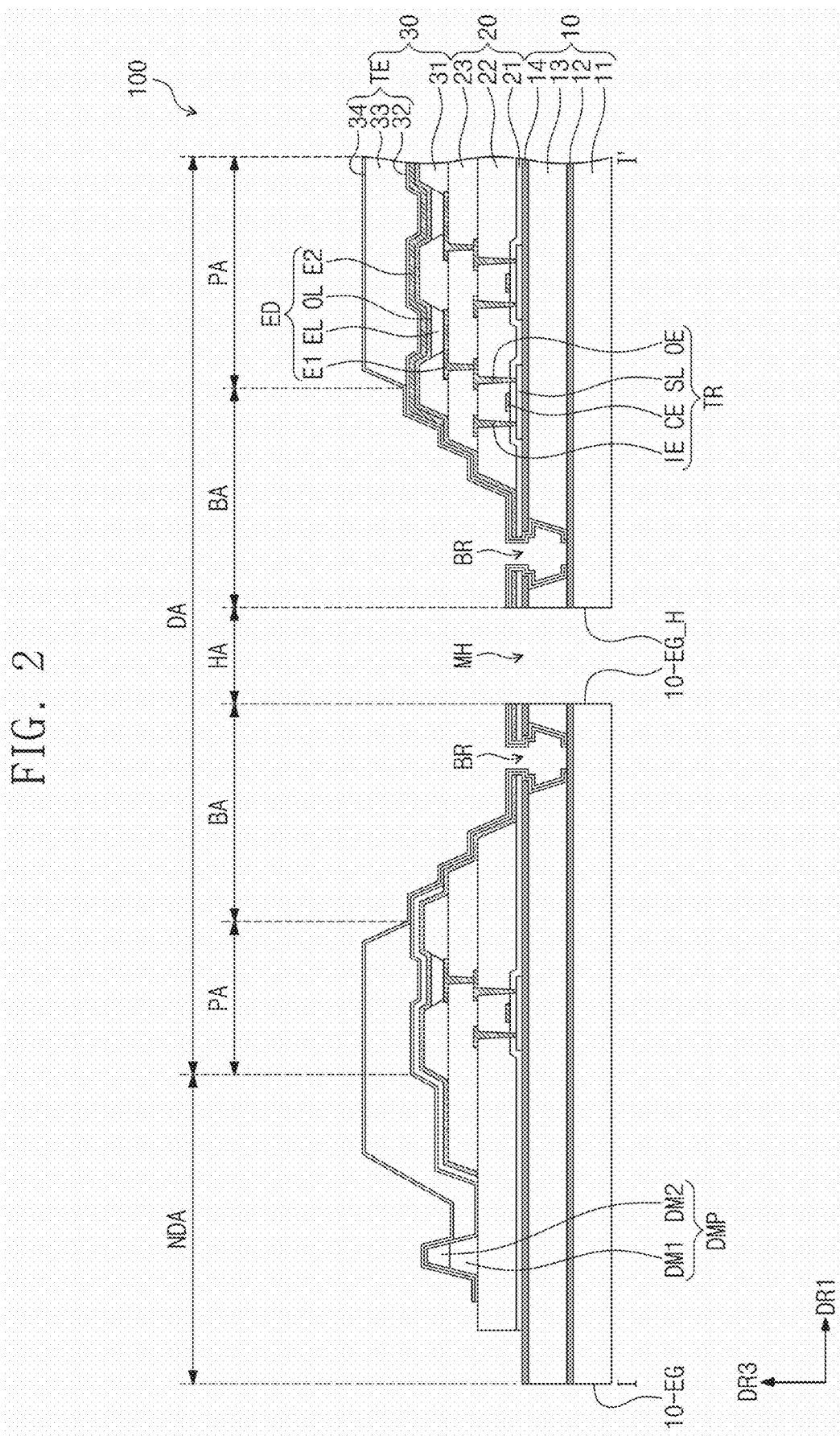
FIG. 2 is a cross-sectional view taken along the line I-I' of FIG. 1B.
Figure 3A:
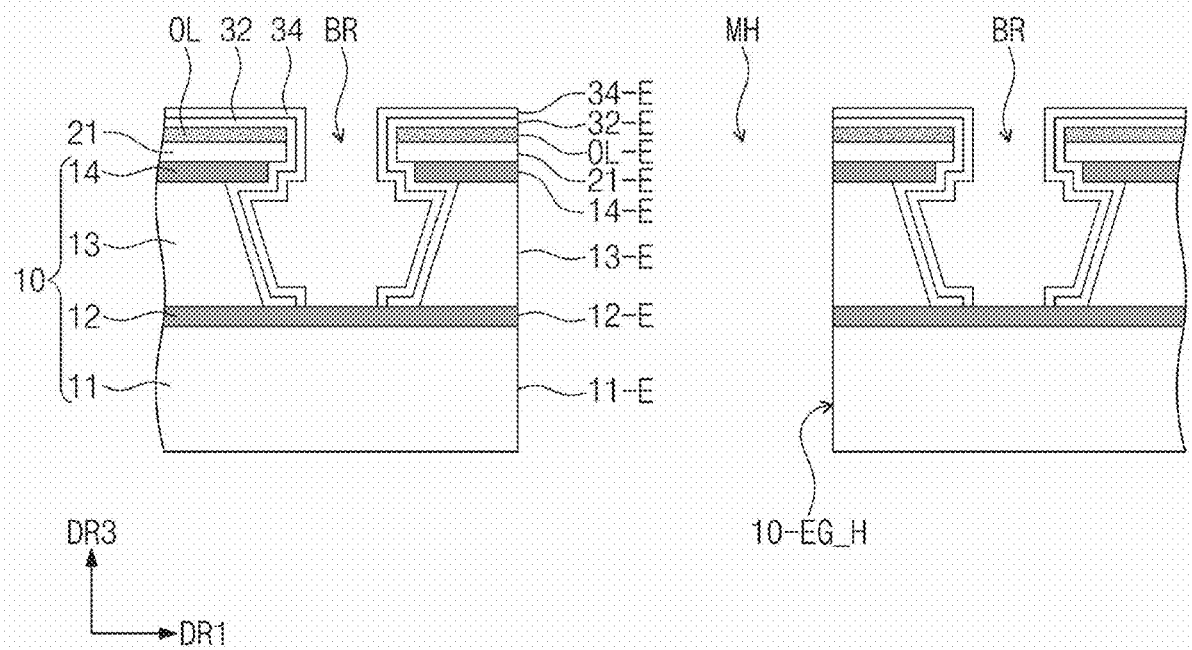
FIG. 3A is an enlarged cross-sectional view of a portion of FIG. 2.
Figure 3B:
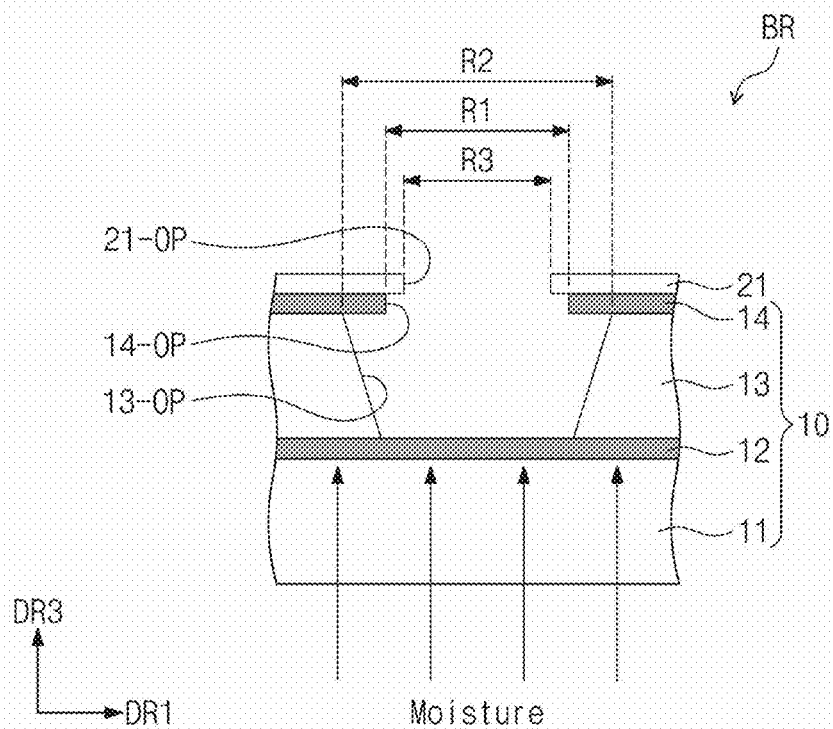
FIG. 3B is an enlarged cross-sectional view of a portion of FIG. 3A.

FIG. 2 is a cross-sectional view taken along the line I-I' of FIG. 1B; FIG. 3A is an enlarged cross-sectional view of a portion of FIG. 2; and FIG. 3B is an enlarged cross-sectional view of a portion of FIG. 3A.

According to FIG. 2, the display area DA and the non-display area NDA are illustrated. According to an embodiment, the display area DA may include a hole area HA in which the first hole MH is formed, a peripheral area BA which surrounds the hole area HA and in which the second hole BR is formed, and a pixel area PA which surrounds the peripheral area BA. An organic light emitting element ED may be disposed on a thin film element layer 20 to overlap with the pixel area PA. The hole area HA may not overlap with a base substrate 10, the thin film element layer 20, and a display element layer 30, and the peripheral area BA may not overlap with the organic light emitting element ED.

Referring to FIG. 2, the display panel 100 may include the base substrate 10, the thin film element layer 20, and the display element layer 30.

The thin film element layer 20 and the display element layer 30 may be included in a pixel layer. The base substrate 10, the thin film element layer 20, and the display element layer 30 may be stacked in the third direction DR3.

The base substrate 10 may include a first base layer 11, a first barrier layer 12, a second base layer 13, and a second barrier layer 14.

The first base layer 11 may correspond to a lower layer of the base substrate 10. A rear surface of the first base layer 11 may define a rear surface of the base substrate 10.

In an embodiment, the first base layer 11 may be an insulating layer including an organic material. In an embodiment, the first base layer 11 may include a flexible plastic. For example, the first base layer 11 may include polyimide (PI), polyethylene naphthalate (PEN), polyethylene terephthalate (PET), polyarylate, polycarbonate (PC), polyetherimide (PEI), or polyether sulfone (PES).

In an embodiment, the first barrier layer 12 may include an inorganic material and may be disposed on the first base layer 11. In other words, the first barrier layer 12 may be an insulating layer including the inorganic material. For example, the first barrier layer 12 may include silicon oxide (SiOx), silicon nitride (SiNx), or amorphous silicon (Si).

The second base layer 13 may be disposed on the first barrier layer 12 and may be an insulating layer including an organic material. In an embodiment, the second base layer 13 may include the same material as the first base layer 11.

In an embodiment, the second barrier layer 14 may include an inorganic material, and a front surface of the second barrier layer 14 may define a front surface of the base substrate 10.

The first and second base layers 11 and 13 and the first and second barrier layers 12 and 14 may be alternately stacked. In particular, the first barrier layer 12 and the second barrier layer 14 may block external moisture or oxygen passing through the first base layer 11 and the second base layer 13, respectively.

According to an embodiment of the invention, the first hole MH may penetrate the first base layer 11, the first barrier layer 12, the second base layer 13, and the second barrier layer 14. The second hole BR may surround the first hole MH and may be formed in the second base layer 13 and the second barrier layer 14. The second hole BR is not formed in the first base layer 11 and the first barrier layer 12.

If the second hole BR is formed in the first barrier layer 12 and a portion of the first base layer 11, moisture or oxygen permeating through the rear surface of the first base layer 11 may be transferred to the thin film element layer 20 or the display element layer 30 through the second hole BR. The external moisture or oxygen may be blocked by the first and second barrier layers 12 and 14 including the inorganic material. However, if the second hole BR is defined in both the first and second barrier layers 12 and 14, the moisture or oxygen permeating through the rear surface of the first base layer 11 may be provided to the pixel area PA through the second hole BR.

However, the second hole BR according to the invention surrounds the first hole MH and is formed in the second base layer 13 and the second barrier layer 14. In other words, the second hole BR according to the invention is not formed in the first base layer 11 and the first barrier layer 12.

In an embodiment, external laser light may be used to form the first hole MH and the second hole BR. In this case, the first hole MH may be formed by laser light of a first wavelength band, and the second hole BR may be formed by laser light of a second wavelength band. The laser light of the first wavelength band may completely recess a portion of the base substrate 10 to form the first hole MH. The laser light of the second wavelength band may recess a portion of the second barrier layer 14 and a portion of the second base layer 13 to form the second hole BR.

According to an embodiment of the invention, the first barrier layer 12 may include a plurality of first inorganic films having a first refractive index and a plurality of second inorganic films having a second refractive index. The first inorganic films and the second inorganic films may be alternately stacked. The first refractive index may be different from the second refractive index.

In an embodiment, when the laser light of the second wavelength band used to form the second hole BR is incident on the first barrier layer 12, the first barrier layer 12 may reflect the laser light of the second wavelength band. Thus, the second hole BR may not be formed in the first barrier layer 12 and the first base layer 11 by the laser light of the second wavelength band. As a result, moisture or oxygen permeating through the rear surface of the first base layer may be blocked by the first barrier layer 12. The structure of the first barrier layer 12 will be described later in more detail.

The thin film element layer 20 may be disposed on the base substrate 10. The thin film element layer 20 may include a plurality of insulating layers and a thin film transistor TR. Each of the insulating layers may include an inorganic material and/or an organic material. The insulating layers may include first to third insulating layers 21, 22, and 23.

The thin film transistor TR may include a semiconductor pattern SL, a control electrode CE, an input electrode IE, and an output electrode OE. The thin film transistor TR may control movement of charges in the semiconductor pattern SL by the control electrode CE to output an electrical signal, inputted from the input electrode IE, through the output electrode OE.

The first insulating layer 21 may be disposed between the semiconductor pattern SL and the control electrode CE. In the present embodiment, the control electrode CE is disposed on the semiconductor pattern SL. However, embodiments of the invention are not limited thereto. In another embodiment, the thin film transistor TR may include the semiconductor pattern SL disposed on the control electrode CE.

The second insulating layer 22 may be disposed between the control electrode CE and the input and output electrodes IE and OE. The second insulating layer 22 may cover the control electrode CE, and the input and output electrodes IE and OE may be disposed on the second insulating layer 22. The input electrode IE and the output electrode OE may penetrate the first and second insulating layers 21 and 22 so as to be connected to portions of the semiconductor pattern SL, respectively. However, embodiments of the invention are not limited thereto. In another embodiment, the input electrode IE and the output electrode OE may be connected directly to the semiconductor pattern SL.

The third insulating layer 23 may be disposed on the second insulating layer 22. The third insulating layer 23 may cover the thin film transistor TR. The third insulating layer 23 may electrically insulate the thin film transistor TR from the display element layer 30.

The display element layer 30 may include the organic light emitting element ED and a plurality of insulating layers. The insulating layers of the display element layer 30 may include a fourth insulating layer 31 and an encapsulation member TE.

The fourth insulating layer 31 may be disposed on the third insulating layer 23. A plurality of openings may be defined in the fourth insulating layer 31. The organic light emitting element ED may be provided in each of the openings.

The organic light emitting element ED may overlap with the pixel area PA. The organic light emitting element ED may include a first electrode E1, a second electrode E2, an emission layer EL, and a charge control layer OL. The first electrode E1 may be disposed on the thin film element layer 20. The first electrode E1 may penetrate the third insulating layer 23 so as to be electrically connected to the thin film transistor TR (e.g., the output electrode OE of the thin film transistor TR). The first electrode E1 may be provided in plurality. At least a portion of each of the first electrodes E1 may be exposed by each of the openings.

The second electrode E2 may be disposed on the first electrode E1. The second electrode E2 may have a single body shape overlapping with the plurality of first electrodes E1 and the fourth insulating layer 31. When the organic light emitting element ED is provided in plurality, the second electrode E2 of the organic light emitting elements ED may have a common voltage. Thus, an additional patterning process for forming the second electrode E2 may be omitted. However, embodiments of the invention are not limited thereto. In another embodiment, the second electrode E2 may be provided in plurality, and the plurality of second electrodes E2 may correspond to the plurality of openings, respectively.

The emission layer EL may be disposed between the first electrode E1 and the second electrode E2. The emission layer EL may be provided in plurality, and the plurality of emission layers EL may be disposed in the plurality of openings, respectively. The organic light emitting element ED may activate the emission layer EL by a potential difference between the first and second electrodes E1 and E2 to generate light.

The charge control layer OL may be disposed between the first electrode E1 and the second electrode E2. The charge control layer OL may be disposed adjacent to the emission layer EL. In the present embodiment, the charge control layer OL is disposed between the emission layer EL and the second electrode E2. However, embodiments of the invention are not limited thereto. In other embodiments, the charge control layer OL may be disposed between the emission layer EL and the first electrode E1, or the charge control layer OL may include a plurality of layers stacked in the third direction DR3 with the emission layer EL interposed therebetween.

In an embodiment, the charge control layer OL may have a single body shape overlapping with substantially an entire top surface of the base substrate 10, without an additional patterning process. The charge control layer OL may be disposed in the openings and may also be disposed on a top surface of the fourth insulating layer 31.

The encapsulation member TE may be disposed on the organic light emitting element ED. The encapsulation member TE may include an inorganic layer and/or an organic layer. In the present embodiment, the encapsulation member TE may include a first inorganic layer 32, an organic layer 33, and a second inorganic layer 34.

Each of the first and second inorganic layers 32 and 34 may include an inorganic material. For example, each of the first and second inorganic layers 32 and 34 may include at least one of aluminum oxide, silicon oxide, silicon nitride, silicon oxynitride, silicon carbide, titanium oxide, zirconium oxide, or zinc oxide. The first inorganic layer 32 and the second inorganic layer 34 may include the same material or different materials from each other.

The organic layer 33 may be disposed between the first inorganic layer 32 and the second inorganic layer 34. The organic layer 33 may include an organic material. For example, the organic layer 33 may include at least one of epoxy, polyimide (PI), polyethylene terephthalate (PET), polycarbonate (PC), polyethylene (PE), or polyacrylate.

In an embodiment, each of the first and second inorganic layers 32 and 34 may have a single body shape disposed on substantially an entire surface of the display panel 100. Each of the first and second inorganic layers 32 and 34 may partially overlap with the organic layer 33. Thus, the first inorganic layer 32 and the second inorganic layer 34 may be spaced apart from each other in the third direction DR3 with the organic layer 33 interposed therebetween in an area and may be in direct contact with each other in the third direction DR3 in another area.

In an embodiment, the display panel 100 may further include a dam portion DMP. The dam portion DMP may extend in the non-display area NDA along an edge of the display area DA (see FIG. 2). The dam portion DMP may surround the display area DA.

In an embodiment, the dam portion DMP may include a first dam DM1 and a second dam DM2. In an embodiment, the first dam DM1 may include the same material as the third insulating layer 23, and the first dam DM1 may be formed concurrently (e.g., simultaneously) with the third insulating layer 23 and may be disposed on the same layer as the third insulating layer 23.

The second dam DM2 may be stacked on the first dam DM1. In an embodiment, the second dam DM2 may include the same material as the fourth insulating layer 31, and the second dam DM2 may be formed concurrently (e.g., simultaneously) with the fourth insulating layer 31 and may be disposed on the same layer as the fourth insulating layer 31. However, embodiments of the invention are not limited thereto. In another embodiment, the dam portion DMP may have a single-layered structure.

The dam portion DMP may define an area in which a liquid organic material is spread in a process of forming the organic layer 33. In an embodiment, a liquid organic material may be provided onto the first inorganic layer 32 by an inkjet method to form the organic layer 33. At this time, the dam portion DMP may define a boundary of an area in which the liquid organic material is disposed, thereby preventing or substantially preventing the liquid organic material from overflowing to the outside.

Herein, the area in which the first and second holes MH and BR are defined will be described in more detail with reference to FIGS. 3A and 3B. In FIG. 3B, the first and second inorganic layers 32 and 34 are not shown for the purpose of ease and convenience in description and illustration. The first hole MH may penetrate the display panel 100 along the third direction DR3. Since the first hole MH is defined in the display area DA, the first hole MH may penetrate some of the layers constituting the display area DA as well as the base substrate 10.

In more detail, the first hole MH may penetrate the base substrate 10. An inner surface 10-EG_H of the first hole MH may be defined by ends of a plurality of layers. An end 11-E of the first base layer 11, an end 12-E of the first barrier layer 12, an end 13-E of the second base layer 13, and an end 14-E of the second barrier layer 14 may be defined at the first base layer 11, the first barrier layer 12, the second base layer 13, and the second barrier layer 14, respectively.

In addition, the first hole MH may also penetrate at least one or more of the layers constituting the display area DA. For example, the first hole MH may penetrate the first insulating layer 21, the charge control layer OL, the first inorganic layer 32, and the second inorganic layer 34. Thus, an end 21-E of the first insulating layer 21, an end OL-E of the charge control layer OL, an end 32-E of the first inorganic layer 32, and an end 34-E of the second inorganic layer 34 may be defined at the first insulating layer 21, the charge control layer OL, the first inorganic layer 32, and the second inorganic layer 34, respectively.

In the present embodiment, the end 11-E of the first base layer 11, the end 12-E of the first barrier layer 12, the end 13-E of the second base layer 13, the end 14-E of the second barrier layer 14, the end 21-E of the first insulating layer 21, the end OL-E of the charge control layer OL, the end 32-E of the first inorganic layer 32, and the end 34-E of the second inorganic layer 34 may be aligned with each other in the third direction DR3. Thus, the first hole MH may have the cylindrical shape having the height in the third direction DR3. However, embodiments of the invention are not limited thereto. In another embodiment, at least one of the ends of the layers defining the first hole MH may not be aligned with at least another of the ends. In the present embodiment, the first hole MH has the cylindrical shape. However, embodiments of the invention are not limited thereto. In other embodiments, the first hole MH may have a quadrilateral pillar shape or a polygonal pillar shape, for example.

The second hole BR may be defined adjacent to the first hole MH. The second hole BR may be spaced apart from the first hole MH in the first direction DR1. The second hole BR may be recessed from the front surface of the base substrate 10 in the third direction DR3. The second hole BR may penetrate the front surface of the base substrate 10 but may not penetrate the rear surface of the base substrate 10.

The second hole BR may be formed by removing a portion of the base substrate 10. For example, the second hole BR may be formed by removing a portion of the second base layer 13 and a portion of the second barrier layer 14.

According to an embodiment of the invention, the second hole BR may include an inner surface which is defined in the base substrate 10 and has an undercut shape. The second hole BR may include a first sub-hole 14-OP penetrating the second barrier layer 14, and a second sub-hole 13-OP overlapping with the first sub-hole 14-OP and defined in the second base layer 13. The first sub-hole 14-OP and the second sub-hole 13-OP may form the undercut shape at the inner surface of the second hole BR.

The second sub-hole 13-OP defined in the second base layer 13 and the first sub-hole 14-OP penetrating the second barrier layer 14 may be stacked in a direction from the first barrier layer 12 toward the front surface of the base substrate 10. The first sub-hole 14-OP penetrating the second barrier layer 14 and the second sub-hole 13-OP defined in the second base layer 13 may form the undercut shape.

In an embodiment, an inner surface of the first sub-hole 14-OP penetrating the second barrier layer 14 may be aligned with an inner surface of the second sub-hole 13-OP defined in the second base layer 13 or may laterally protrude from the inner surface of the second sub-hole 13-OP defined in the second base layer 13. When the inner surface of the first sub-hole 14-OP laterally protrudes from the inner surface of the second sub-hole 13-OP, the undercut shape may be formed between the first sub-hole 14-OP penetrating the second barrier layer 14 and the second sub-hole 13-OP defined in the second base layer 13.

In an embodiment, the second sub-hole 13-OP defined in the second base layer 13 may have different planar areas along the third direction DR3. In an embodiment, a width of the second sub-hole 13-OP in the first direction DR1 at a rear surface of the second base layer 13 may be less than a width of the second sub-hole 13-OP in the first direction DR1 at a front surface of the second base layer 13. In an embodiment, the second sub-hole 13-OP defined in the second base layer 13 may have a truncated cone shape. However, embodiments of the invention are not limited thereto. In other embodiments, the second sub-hole 13-OP defined in the second base layer 13 may have a truncated pyramid shape or a truncated elliptical cone shape, which corresponds to the shape of the second hole BR in a plan view.

In an embodiment, the thin film element layer 20 and the display element layer 30 may partially overlap with the second hole BR. For example, the first insulating layer 21 may extend adjacent to the second hole BR and may partially overlap with the second hole BR. The first insulating layer 21 may cover at least a portion of the second hole BR. The first insulating layer 21 may include a third sub-hole 21-OP defined in an area corresponding to the second hole BR. The third sub-hole 21-OP of the first insulating layer 21 may overlap with the second hole BR.

In the present embodiment, a width R3 in the first direction DR1 of the third sub-hole 21-OP of the first insulating layer 21 may be equal to or less than a width R1 in the first direction DR1 of the first sub-hole 14-OP penetrating the second barrier layer 14. An inner surface of the third sub-hole 21-OP of the first insulating layer 21 may be aligned with the inner surface of the first sub-hole 14-OP penetrating the second barrier layer 14 or may laterally protrude from the inner surface of the first sub-hole 14-OP penetrating the second barrier layer 14. When the inner surface of the third sub-hole 21-OP laterally protrudes from the inner surface of the first sub-hole 14-OP, an undercut shape may be formed between the third sub-hole 21-OP of the first insulating layer 21 and the first sub-hole 14-OP penetrating the second barrier layer 14.

The charge control layer OL may extend to an area adjacent to the first hole MH and an area adjacent to the second hole BR. The charge control layer OL may not overlap with at least a portion of the second hole BR. Thus, the charge control layer OL may have a cut end adjacent to the second hole BR.

The first inorganic layer 32 and the second inorganic layer 34 may extend to the area in which the second hole BR is disposed. In an embodiment, the first and second inorganic layers 32 and 34 may be disposed in an area adjacent to the second hole BR and may extend along the inner surface of the second hole BR. Thus, an inside of the second hole BR may be covered by the first inorganic layer 32 and the second inorganic layer 34.

According to an embodiment of the invention, the charge control layer OL may have the cut end adjacent to the second hole BR and may not overlap with at least a portion of the second hole BR. The cut end, adjacent to the second hole BR, of the charge control layer OL is covered by the first inorganic layer 32 and the second inorganic layer 34.

As illustrated in FIGS. 3A and 3B, the base substrate 10, the thin film element layer 20, and the display element layer 30 may have cut ends in the area adjacent to the first hole MH. The cut ends are exposed through the first hole MH. Moisture or oxygen outside the display panel 100 may be provided to the base substrate 10, the thin film element layer 20 and the display element layer 30 through the ends exposed by the first hole MH.

However, according to embodiments of the invention, since the second hole BR is defined adjacent to the first hole MH, the moisture or oxygen provided from the first hole MH may be blocked. In more detail, as illustrated in FIG. 3A, the charge control layer OL of which the end OL-E is exposed by the first hole MH does not extend to the second hole BR, but is cut. The second hole BR may separate a portion of the charge control layer OL disposed between the first and second holes MH and BR from another portion of the charge control layer OL disposed outside the second hole BR. Thus, even though external moisture or oxygen is provided through the first hole MH, the external moisture or oxygen may not be transferred to the outside of the second hole BR. As a result, it is possible to stably prevent damage of the thin film element layer 20 and/or the display element layer 30 existing outside the second hole BR.

In addition, according to an embodiment of the invention, the first inorganic layer 32 and the second inorganic layer 34 may cover the portion between the first and second holes MH and BR, the inside of the second hole BR, and the outside of the second hole BR. In other words, the charge control layer OL and/or the first insulating layer 21, which are adjacent to the second hole BR and are cut, may be covered by the first inorganic layer 32 and the second inorganic layer 34. Thus, the external moisture or oxygen may further be blocked.

Figure 5:
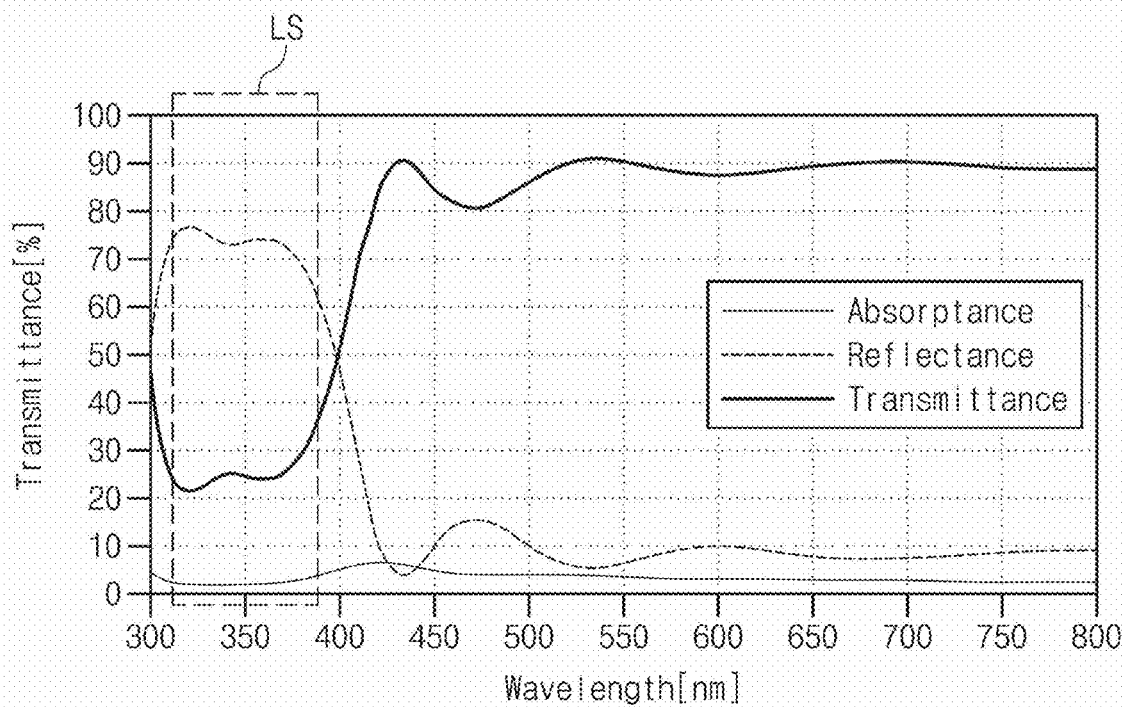
FIG. 5 is a graph showing characteristics of a laser transmitted through a first barrier layer, according to an embodiment of the invention.
Figure 6:
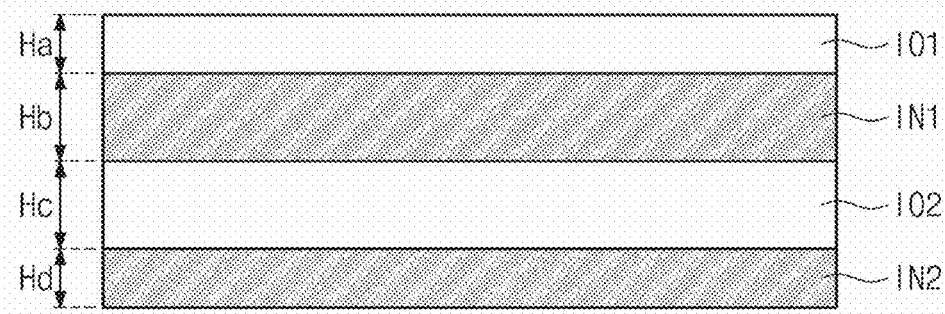
FIG. 6 is a cross-sectional view illustrating a portion of the first barrier layer of FIG. 4, according to an embodiment of the invention.

FIG. 4 is a cross-sectional view illustrating a first barrier layer of FIG. 2, according to an embodiment of the invention. FIG. 5 is a graph showing characteristics of a laser transmitted through a first barrier layer, according to an embodiment of the invention. FIG. 6 is a cross-sectional view illustrating a portion of the first barrier layer of FIG. 4, according to an embodiment of the invention.

Referring to FIG. 4, the first barrier layer 12 may include a plurality of reflective layers INL1 to INLn. The reflective layers INL1 to INLn may block or reflect laser light of a specific wavelength band. Here, the laser light of the specific wavelength band may be the laser light of the second wavelength band which is used to form the second hole BR described with reference to FIG. 2.

According to FIG. 5, for example, the laser light LS of the second wavelength band may have a wavelength in a range from 300 nm to 400 nm. In the graph of FIG. 5, the horizontal axis represents a wavelength and the vertical axis represents absorptance, reflectance, and transmittance of light. The laser light LS may remove a portion of the second barrier layer 14 and a portion of the second base layer 13 to form the second hole BR overlapping with the peripheral area BA. In other words, the second barrier layer 14 and the second base layer 13 may have a high absorptance for absorbing the laser light LS of the second wavelength band. In an embodiment, the second barrier layer 14 according to the invention may be formed of a single layer including the inorganic material, and thus the transmittance and reflectance of the laser light LS may be low in the second barrier layer 14.

In an embodiment, the first barrier layer 12 according to the invention may include the plurality of reflective layers INL1 to INLn. Thus, the first barrier layer 12 may have a low absorptance and a low transmittance of the laser light LS in the second wavelength band, but may have a high reflectance of the laser light LS. Thus, the second hole BR may not be formed in the first barrier layer 12 by the laser light LS. As a result, since moisture or oxygen permeating through the rear surface of the first base layer 11 is blocked by the first barrier layer 12, it is possible to prevent or substantially prevent the moisture or oxygen from permeating to the thin film element layer 20 and/or the display element layer 30 through the second hole BR.

Referring again to FIG. 4, according to an embodiment of the invention, each of the reflective layers INL1 to INLn may include a first inorganic film and a second inorganic film, which have different refractive indexes from each other and are stacked. In more detail, the first barrier layer 12 may include a plurality of the first inorganic films IO1 to IOn having a first refractive index and a plurality of the second inorganic films IN1 to INn having a second refractive index. In an embodiment, the second inorganic films IN1 to INn and the first inorganic films IO1 to IOn may be alternately stacked. In addition, a total thickness of the first barrier layer 12 according to the invention may have a certain height H1, and, in an embodiment, the height H1 may be in a range from 550 nm to 600 nm.

Four inorganic films IO1, IO2, IOn−1 and IOn of the first inorganic films IO1 to IOn and four inorganic films IN1, IN2, INn−1 and INn of the second inorganic films IN1 to INn are illustrated in FIG. 4 for the purpose of ease and convenience in description and illustration.

In an embodiment, an uppermost film of the first barrier layer 12 may be an uppermost inorganic film IO1 of the first inorganic films IO1 to IOn, and a lowermost film of the first barrier layer 12 may be the last inorganic film INn of the second inorganic films IN1 to INn.

In an embodiment, the first inorganic films IO1 to IOn may include silicon oxide (SiOx). In an embodiment, the second inorganic films IN1 to INn may include silicon nitride (SiNx). In an embodiment, the second refractive index of the second inorganic films IN1 to INn may be higher than the first refractive index of the first inorganic films IO1 to IOn.

According to the above description, the first barrier layer 12 according to the invention may be provided as a distributed Bragg reflector having a high reflectance. Since each of the reflective layers INL1 to INLn includes the first inorganic film and the second inorganic film which have different refractive indexes from each other, the reflectance to the external laser light may be increased.

In an embodiment, the first inorganic film is formed of silicon oxide (SiOx) and the second inorganic film is formed of silicon nitride (SiNx). However, embodiments of the invention are not limited thereto. In another embodiment, each of the first and second inorganic films may include at least one of SiOx, SiNx, TiOx, AlOx, Al, or Ag. In still another embodiment, the first barrier layer 12 may be provided as a metal layer.

Referring to FIG. 6, at least two or more of the first inorganic films IO1 to IOn according to the invention may have different thicknesses from each other. For example, an uppermost first inorganic film IO1 may have a first height Ha and a next-uppermost first inorganic film IO2 may have a second height Hc. In an embodiment, the second height Hc of the next-uppermost first inorganic film IO2 may be greater than the first height Ha of the uppermost first inorganic film IO1.

In addition, at least two or more of the second inorganic films IN1 to INn according to the invention may have different thicknesses from each other. For example, an uppermost second inorganic film IN1 may have a third height Hb and a next-uppermost second inorganic film IN2 may have a fourth height Hd. In an embodiment, the fourth height Hd of the next-uppermost second inorganic film IN2 may be less than the third height Hb of the uppermost second inorganic film IN1.

In an embodiment, as illustrated in FIG. 6, the first height Ha may be different from the third height Hb, and the second height Hc may be different from the fourth height Hd. In other words, in an embodiment, the first inorganic films IO1 to IOn and the second inorganic films IN1 to INn may have different thicknesses from each other.

FIGS. 7A to 7D are cross-sectional views illustrating a method of manufacturing a display panel, according to an embodiment of the invention. FIG. 7E is an image showing a base substrate, according to an embodiment of the invention.

As illustrated in FIG. 7A, an untreated base substrate 10_I1 may be provided. The untreated base substrate 10_I1 may include a first untreated base layer 11_I, a first untreated barrier layer 12_I, a second untreated base layer 13_I, and a second untreated barrier layer 14_I. The first untreated base layer 11_I and the second untreated base layer 13_I may be stacked alternately with the first untreated barrier layer 12_I and the second untreated barrier layer 14_I.

The first untreated base layer 11_I, the first untreated barrier layer 12_I, the second untreated base layer 13_I, and the second untreated barrier layer 14_I may be sequentially stacked in an upward direction. The first untreated base layer 11_I may correspond to a lowermost layer of the untreated base substrate 10_I1, and the second untreated barrier layer 14_I may correspond to an uppermost layer of the untreated base substrate 10_I1.

Thereafter, as illustrated in FIG. 7B, a cover layer MSL may be formed on the second untreated barrier layer 14_I. The cover layer MSL may cover the second untreated barrier layer 14_I.

The cover layer MSL may be formed using at least one of the thin film element layer 20 (see FIG. 2) and the display element layer 30 (see FIG. 2), described above. For example, the cover layer MSL may be formed using at least one of the first to fourth insulating layers 21, 22, 23, and 31 and the electrodes CE, IE, OE, and E1 (see FIG. 2).

A through-opening MSL-OP exposing at least a portion of the second untreated barrier layer 14_I may be formed in the cover layer MSL. In an embodiment, the through-opening MSL_OP of the cover layer MSL may be formed concurrently (e.g., simultaneously) in a process of forming at least one of the first to fourth insulating layers 21, 22, 23, and 31 and the electrodes CE, IE, OE, and E1. Thus, the cover layer MSL may be formed using an existing process without an additional process, and, thus, a process time and a process cost may be reduced.

Thereafter, as illustrated in FIG. 7C, laser light LS may be provided onto the cover layer MSL. The laser light LS may be laser light having a wavelength band in a range from 300 nm to 400 nm. The laser light LS may be light provided in an etching process. As illustrated in FIG. 7C, in an embodiment, the laser light LS may be provided in a radial form WV. Thus, each of the layers may be etched in a shape of which a width becomes wider toward a top thereof.

The first untreated base layer 11_I, the first untreated barrier layer 12_I, the second untreated base layer 13_I, and the second untreated barrier layer 14_I of FIG. 7B may be changed into a first thermally treated base layer 11_T, a first thermally treated barrier layer 12_T, a second thermally treated base layer 13_T, and a second thermally treated barrier layer 14_T by the laser light LS, respectively.

In this case, the shapes of the second untreated base layer 13_I and the second untreated barrier layer 14_I may be different from those of the second thermally treated base layer 13_T and the second thermally treated barrier layer 14_T. In other words, as illustrated in FIG. 7D, a second hole BR_A may be formed in the second thermally treated base layer 13_T and the second thermally treated barrier layer 14_T.

Figure 7E:
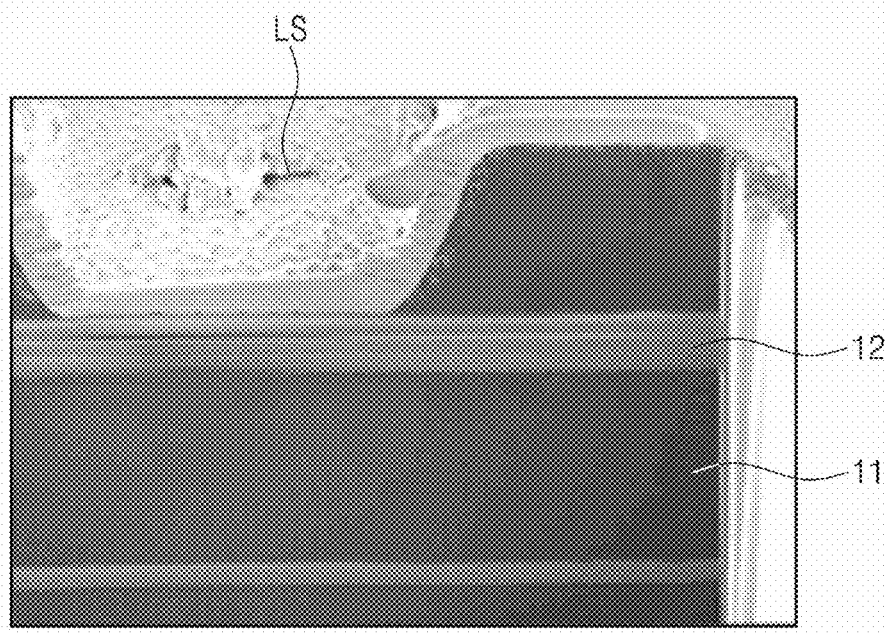
FIG. 7E is an image showing a base substrate, according to an embodiment of the invention.

On the contrary, the shapes of the first untreated base layer 11_I and the first untreated barrier layer 12_I may be the same or substantially the same as those of the first thermally treated base layer 11_T and the first thermally treated barrier layer 12_T. As illustrated in FIG. 7E, since the first barrier layer 12 reflects most of the laser light LS, a hole may not be formed in the first barrier layer 12 and the first base layer 11 by the laser light LS.

In addition, as illustrated in FIG. 7D, an inner surface of the second hole BR_A may have an undercut shape by a difference in absorption between the layers with respect to the laser light LS, when viewed in a cross-sectional view. Like a region "BB," the second thermally treated base layer 13_T may be undercut with respect to the second thermally treated barrier layer 14_T. Thus, an inner surface of a first sub-hole penetrating the second thermally treated barrier layer 14_T may laterally protrude from an inner surface of a second sub-hole defined in the second thermally treated base layer 13_T.

Figure 8:
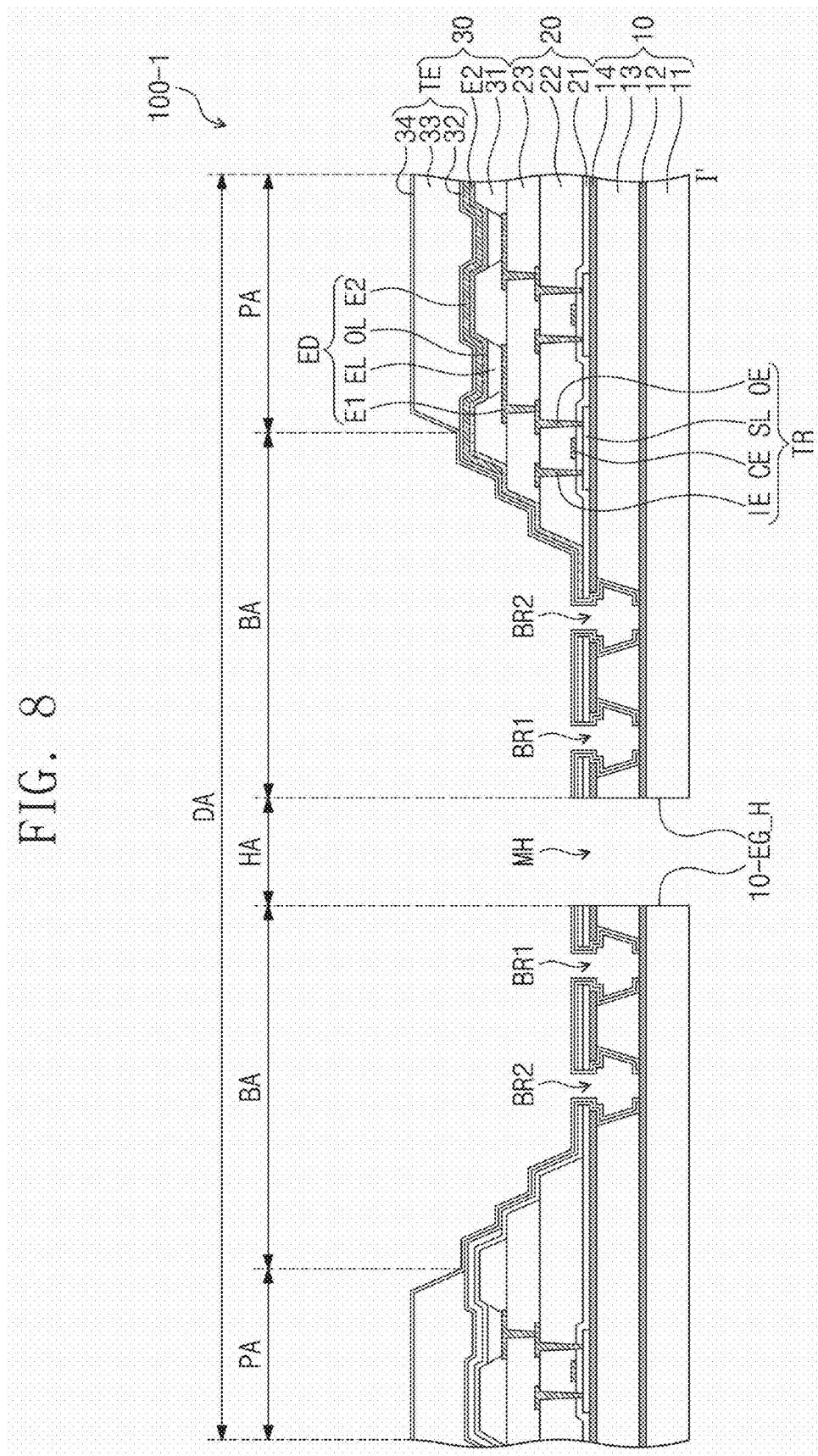
FIG. 8 is a cross-sectional view illustrating a display panel of an electronic device, according to another embodiment of the invention.

FIG. 8 is a cross-sectional view illustrating a display panel of an electronic device, according to another embodiment of the invention.

Referring to FIG. 8, a display panel 100-1 may further include a third hole BR2, as compared with the display panel 100 illustrated in FIG. 2. The other components of the display panel 100-1 of FIG. 8 may be the same or substantially the same as corresponding components of the display panel 100 illustrated in FIG. 2, and, thus, descriptions thereof will be omitted.

In the present embodiment, the third hole BR2 recessed from the front surface of the base substrate 10 may further be defined in the base substrate 10. The third hole BR2 may be closer to a second hole BR1 than to the first hole MH overlapping with the hole area HA, when viewed in a plan view. The second hole BR1 may surround the first hole MH and may be spaced apart from the first hole MH by a distance (e.g., a predetermined distance), when viewed in a plan view. The third hole BR2 may surround the second hole BR1 and may be spaced apart from the second hole BR1 by a distance (e.g., a predetermined distance), when viewed in a plan view.

Structures of the second and third holes BR1 and BR2 may be the same or substantially the same as the structure of the second hole BR illustrated in FIG. 2. Thus, descriptions of the structures of the second and third holes BR1 and BR2 are omitted.

According to the above descriptions, moisture or oxygen permeating through the first hole MH may be blocked by the second and third holes BR1 and BR2, and, thus, it is possible to effectively prevent the moisture or oxygen from being transferred to the thin film element layer 20 and/or the display element layer 30.

According to the invention, it is possible to effectively prevent the element from being damaged by moisture or oxygen permeating from the outside. Thus, the reliability of the electronic device in a manufacturing process and in use may be improved.

In particular, it is possible to block moisture or oxygen permeating through the rear surface of the base substrate of the display panel.

While the invention has been described with reference to some example embodiments, it will be apparent to those skilled in the art that various changes and modifications may be made without departing from the spirit and scope of the invention. Therefore, it should be understood that the above embodiments are not limiting but, rather, are illustrative. Thus, the scope of the invention is to be determined by the broadest permissible interpretation of the claims and their equivalents, and shall not be restricted or limited by the foregoing description.

What is claimed is:

1. A display panel comprising:
    a base substrate which includes a front surface and a rear surface and in which a through-portion and a first recessed-portion are defined, wherein the through-portion penetrates the front surface and the rear surface, and wherein the first recessed-portion is adjacent to the through-portion, and is recessed from the front surface; and
    a pixel layer on the front surface of the base substrate, wherein the base substrate comprises:
    a first base layer including the rear surface of the base substrate;
    a first barrier layer on the first base layer and comprising at least two inorganic films with different refractive indexes;
    a second base layer on the first barrier layer; and
    a second barrier layer on the second base layer and including the front surface of the base substrate.

2. The display panel of claim 1, wherein the first recessed-portion surrounds the through-portion when viewed in a plan view.

3. The display panel of claim 1, wherein the first recessed-portion is defined in the second base layer and the second barrier layer.

4. The display panel of claim 1, wherein the first recessed-portion is not defined in the first base layer and the first barrier layer.

5. The display panel of claim 1, wherein the at least two inorganic films have different thicknesses from each other.

6. The display panel of claim 1, wherein a plurality of second recessed-portions is further defined in the base substrate,
    wherein the second recessed-portions are closer to the first recessed-portion than to the through-portion, when viewed in a plan view, and
    wherein the second recessed-portions are recessed from the front surface of the base substrate.

7. The display panel of claim 6, wherein the second recessed-portions surround the first recessed-portion in the plan view.

8. The display panel of claim 6, wherein the second recessed-portions are not defined in the first base layer and the first barrier layer.

9. The display panel of claim 1, wherein the first barrier layer includes first inorganic films having a first refractive index; and a plurality of second inorganic films having a second refractive index,
    wherein the first inorganic films and the second inorganic films are alternately stacked.

10. The display panel of claim 9, wherein at least two or more of the first inorganic films have different thicknesses from each other, and at least two or more of the second inorganic films have different thicknesses from each other.

11. The display panel of claim 9, wherein an uppermost film of the first barrier layer is one of the first inorganic films, and a lowermost film of the first barrier layer is one of the second inorganic films,
    wherein the second refractive index is higher than the first refractive index.

12. The display panel of claim 1, wherein the first recessed-portion is disposed between the through-portion and the pixel layer in a plan view.

13. An electronic device comprising:
    a display panel comprising: a base substrate which includes a front surface and a rear surface and in which a through-portion and a first recessed-portion are defined, wherein the through-portion penetrates the front surface and the rear surface, and wherein the first recessed-portion is recessed from the front surface; and
    an electronic module overlapping the through-portion, wherein the base substrate comprises:
    a first base layer including the rear surface of the base substrate;
    a first barrier layer on the first base layer and comprising at least two inorganic films with different refractive indexes;
    a second base layer on the first barrier layer; and
    a second barrier layer on the second base layer and including the front surface of the base substrate.

14. The electronic device of claim 13, wherein the first recessed-portion has a closed loop shape surrounding the through-portion, when viewed in a plan view.

15. The electronic device of claim 13, wherein the first recessed-portion is defined in the second base layer and the second barrier layer,
    wherein the first recessed-portion is not defined in the first base layer and the first barrier layer.

16. The electronic device of claim 13, wherein a plurality of second recessed-portions is further defined in the base substrate,
    wherein the second recessed-portions are closer to the first recessed-portion than to the through-portion, when viewed in a plan view, and
    wherein the second recessed-portions are recessed from the front surface of the base substrate.

17. The electronic device of claim 13, wherein the electronic module overlaps with a display area of the display panel.

18. The electronic device of claim 17, wherein the first recessed-portion is disposed between the through-portion and a pixel area included in the display area.

* * * * *